US006307777B1

(12) United States Patent
Katsuhara et al.

(10) Patent No.: US 6,307,777 B1
(45) Date of Patent: Oct. 23, 2001

(54) NONVOLATILE SEMICONDUCTOR STORAGE DEVICE

(75) Inventors: Noriaki Katsuhara; Yoshihiro Tada; Hiromi Uenoyama, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/646,789

(22) PCT Filed: Jan. 24, 2000

(86) PCT No.: PCT/JP00/00315

§ 371 Date: Sep. 21, 2000

§ 102(e) Date: Sep. 21, 2000

(87) PCT Pub. No.: WO00/44001

PCT Pub. Date: Jul. 27, 2000

(30) Foreign Application Priority Data

Jan. 22, 1999 (JP) .................................................. 11-014501

(51) Int. Cl.[7] .................................................... G11C 16/04
(52) U.S. Cl. ................................ 365/185.05; 365/185.09
(58) Field of Search ........................... 365/185.05, 185.09

(56) References Cited

U.S. PATENT DOCUMENTS

| | | | | |
|---|---|---|---|---|
| 4,768,169 | * | 8/1988 | Perlegos . | |
| 5,615,147 | * | 3/1997 | Chang | 365/185.3 |
| 5,905,673 | * | 5/1999 | Khan | 365/185.33 |
| 5,978,307 | * | 11/1999 | Proebsting | 365/230.05 |

FOREIGN PATENT DOCUMENTS

0140698 * 5/1985 (EP) .

* cited by examiner

*Primary Examiner*—A. Zarabian
(74) *Attorney, Agent, or Firm*—Hogan & Hartson, L.L.P.

(57) ABSTRACT

The same information is stored in two memory cells (26 and 26') and the two memory cells are connected in parallel (OR) at a normal reading to synthesize an electric current in conformity with information in the two memory cells. Even if a floating gate and drain are shorted with each other in a storage transistor in one of the memory cells when a tunnel oxide film is deteriorated, destroyed or shorted by a high-tension stress, the discriminating voltage of a sense amplifier is determined so as to ensure normal reading of information in the other memory cell. The two memory cells are separated at test-reading for independent operations to ensure individual testing each memory cell.

6 Claims, 6 Drawing Sheets

NONVOLATILE SEMICONDUCTOR STORAGE DEVICE

TECHNICAL FIELD

The present invention relates the electrically writable and erasable non-volatile semiconductor storage device.

BACKGROUND OF THE INVENTION

So far EEPROM (electrically erasable and programmable ROM) has been used as one of the non-volatile semiconductor storage device.

FIG. 5 illustrates the reading of conventional EEPROM. The memory cell 116 consists of one selection transistor 117 and one storage transistor 118 which are connected to each other in serial. The drain of the selection transistor 117 is connected to the bit line BL, the source is formed commonly with the drain of the storage transistor 118 and the gate is connected to the word line WL. The storage transistor 118 has the floating gate and control gate, the control gate is connected to the control line CL and the source is connected to the common source line SS. The control line is connected to the sense line SL via the transistor 124.

The storage transistor 118 stores information when the floating gate is electrified (at writing or erasing). The electric charge is poured into and extracted from the floating gate by the F-N (Fowler-Nordheim) current via a partial thin film (tunnel oxide film) between the floating gate and drain.

When the floating gate is electrified negatively, the threshold voltage (Vth) of the storage transistor increases. This state is referred to as the erasing state (the state "1"). On the other hand, the floating gate is electrified positively, the threshold voltage (Vth) of the storage transistor decreases. This state is referred to as the writing state (the state "0").

At reading, the intermediate voltage (Vref) between the threshold voltage of the erasing state and that of the writing state is supplied to the sense line SL. If the word line WL is selected, the voltage of the sense line SL is impressed to the control line CL. If the state of the floating gate is "0", a channel is formed between the source and the drain of the storage transistor 118 and then the storage transistor 118 becomes conductive. On the other hand, the state of the floating gate is "1", a channel is not formed between the source and the drain of the storage transistor 118 and, therefore, the storage transistor 118 becomes nonconductive.

If the word line WL is selected, a specified current flows into the memory cell 116 according to the information stored in the storage transistor 118 because the selection transistor 117 has become conductive. The current is supplied to the memory cell 116 by the pull-up PMOS 126 via the bit line selection transistor 128 and the data line DL. The voltage of the data line DL, which depends on the specified current into the memory cell 116 and the current supplied by the pull-up PMOS 126, is amplified and output by the sense amplifier (S. A.) 114.

FIG. 6 is an electric characteristics diagram which illustrates an operation of the sense amplifier 114. A stable voltage point of the data line DL is the intersections (d1 and d2) of the current curves of the memory cells (the state "0" and the state "1") and that of the pull-up PMOS 126. A judgment voltage of the sense amplifier 114 is set at or around the center between the intersection (d1) when the state of the memory cell is "0" and the other intersection (d2) when the state of the memory cell is "1". A data is judged as "0" if the voltage of the data line DL is lower than the judgment voltage and it is judged as "1" if such voltage of the data line DL is higher.

DISCLOSURE OF THE INVENTION

As described above, the conventional non-volatile semiconductor storage device selects one memory cell and reads the stored information.

The F-N current is used to store information in a memory cell as mentioned above and, therefore, high voltage must be impressed to the tunnel oxide film between the floating gate and drain. So, if writing and/or erasing are executed over and over again, due to the stress of high voltage, the tunnel oxide film is deteriorated and some of memory cells may be destroyed and short circuited. The quality of tunnel oxide films of such memory cells is worse than that of any other memory cells and, if even one of such memory cells is destroyed and short-circuited, the entire non-volatile semiconductor storage device becomes disabled. That is to say, the life time of non-volatile semiconductor storage depends on the worst memory cell. The quality of tunnel oxide film is affected by any defect or error in thin film arisen from the inconsistent conditions about forming of tunnel oxide film on a wafer or foreign substance mixed in the film.

FIG. 7 shows the short-circuited memory cell (defective memory cell) of which tunnel oxide film was destroyed. As shown in the electric characteristics diagram of FIG. 6, the current slightly higher than that of memory cell of the state "1" flows at or around the stable voltage point in the defective memory cell. Any data is judged as "1" always in such defective memory cell.

The purpose of the present invention is to extend the life of non-volatile semiconductor storage device and to offer the reliable non-volatile semiconductor storage device.

To solve the problem mentioned above, the invention in this application features that the first and second memory cells included in the several memory cells have the same information in the non-volatile semiconductor storage device in which the several memory cells are located in a direction of a row and in a direction of column, the information is read out by synthesizing the current into the first and second memory cells corresponding to the information stored in such first and second memory cells in the first mode and the control means to read out independently the information stored in the first and second memory cells is enabled in the second mode.

In the non-volatile semiconductor storage device of the present invention, the same information is stored in two memory cells (i.e., the first and second memory cells), the two memory cells are connected to each other in parallel (OR) in the first mode (at normal reading) and the current is synthesized according to the information in the memory cells (the state "0" or the state "1"). Even if the quality of the tunnel oxide film of the storage transistor in either of those two memory cells is poor and the floating gate and drain are short-circuited, the information can be read out correctly from the other memory cell. It is very rare that the quality of the tunnel oxide films of both two memory cells is poor. Therefore, the life of the non-volatile semiconductor storage device can be extended considerably In the second mode (at test reading), the two memory cells are separated from each other so that those cells can operate independently to test those cells individually. This enables to screen the initial defective memory cells.

Moreover, the invention in this application features that, in the non-volatile semiconductor storage device mentioned above, the first memory cell and the second memory cell are connected to a common bit line and those memory cells are not adjoined. Otherwise, the invention in this application features that, in the non-volatile semiconductor storage device mentioned above, the first memory cell and the second memory cell are connected to a common word line and those memory cells are not adjoined.

Even if the quality of tunnel oxide film of either memory cell deteriorates considerably due to an error in the process conditions, the quality of tunnel oxide film of the other memory cell is hardly ever affected and the reliability of the non-volatile semiconductor storage device increases because two memory cells are separated from each other physically in the non-volatile semiconductor storage device of the present invention.

If those two memory cells are connected to a common bit line, the parasitic capacitance of the bit line in the first mode (at normal reading) and that of the bit line in the second mode (at test reading) are the same and, therefore, the difference between the reading conditions in such two modes can be minimized.

If those two memory cells are connected to a common word line, the size in a direction of a column is large and the size in a direction of a row is small in comparison with the memory cells connected to a common bit line. Therefore, the memory cells connected to a common word line are effective in reducing the size in a direction of a row.

Furthermore, the invention in this application features that the first memory cell and the second memory cell are located symmetrically in the non-volatile semiconductor storage device mentioned above.

In the non-volatile semiconductor storage device of the present invention, the stress increase in the tunnel oxide film in either memory cell due to imperfect mask alignment is different from that in the other memory cell and, therefore, the reliability can increase.

BEST MODE FOR CARRYING OUT THE INVENTION

Figure 1:
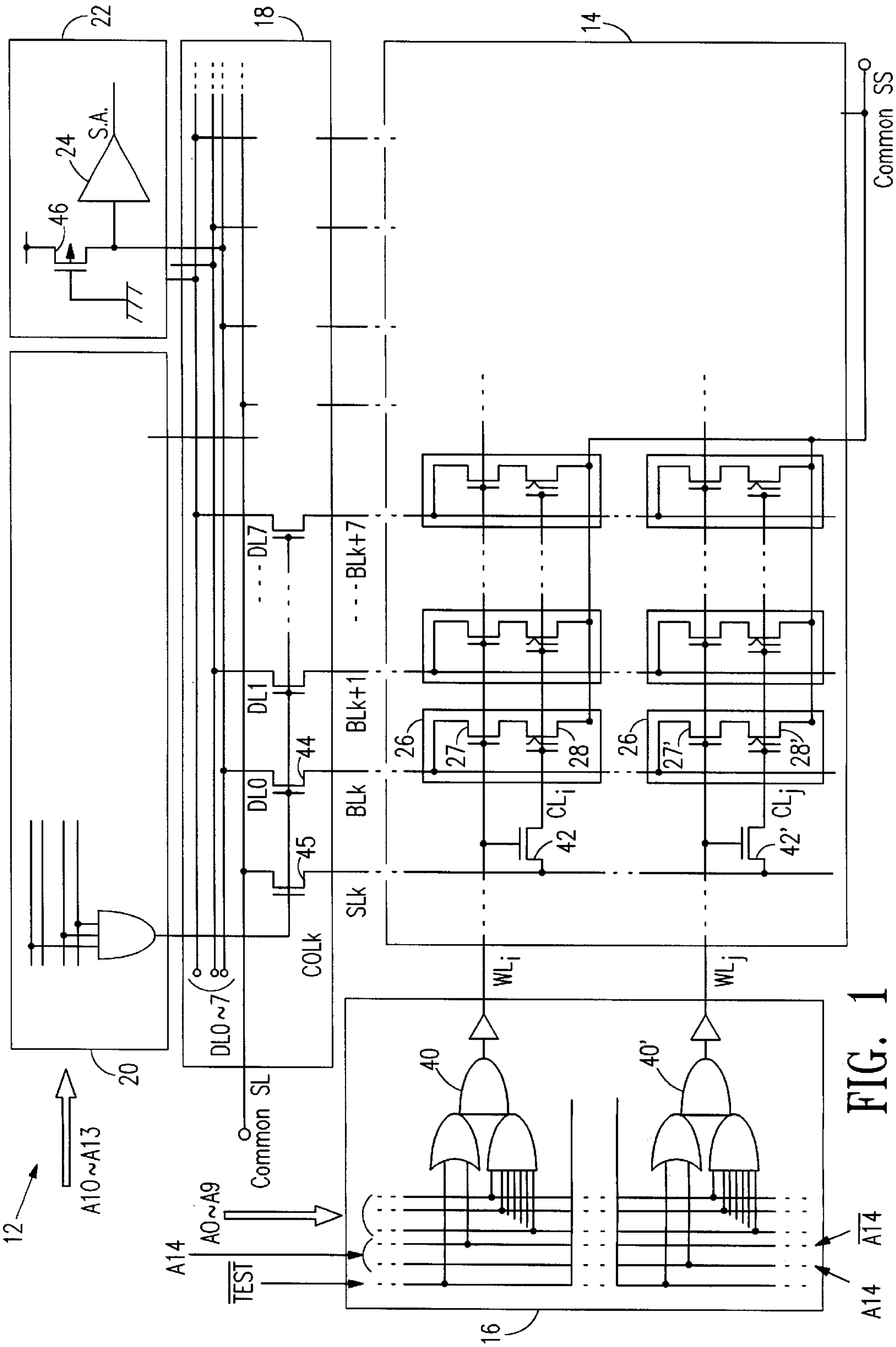
FIG. 1 illustrates the memory block structure in the first embodiment of the present invention.

Now, a description will be given in more detail of preferred embodiments of the present invention with reference to the accompanying drawings. FIG. 1 illustrates the memory block structure of 16 K bytes which is the embodiment of the present invention. The memory block 12 consists of the memory cell array 14, the row decoder 16, the column selector 18, the column decoder 20, and the data I/O unit 22, etc.

There are two ways of reading. One is a normal method (a normal mode) and another one is a test method (a test mode). A test signal line (TEST) is “1” in the normal mode and “0” in the test mode.

For an address signal line input to the memory block 12, the low order address signal lines (A0 to A9) and A14 to distinct the two memory cells from each other at the test mode are connected to the row decoder 16 and the high order address signal lines (A10 to A13) are connected to the column decoder 20.

In the normal mode, when the low order address signals (A0 to A9) are input to the row decoder 16, both of the two word lines (WLi and WLj) are selected by the row decoder 16 and “1” is output to those two word lines. In the normal mode, the test signal line of the combinational circuit 40 of the row decoder 16 is “1” and, regardless of a value of A14, the values of the word lines depend on the values of the low order address signals (A0 to A9). The circuit structure of the combinational circuit 40 is not limited as shown in this figure.

In the test mode, when the low order address signals (A0 to A9) and A14 are input to the row decoder 16, either of the two word lines (WLi or WLj) is selected by the row decoder 16. In the test mode, the test signal line of the combinational circuit 40 of the row decoder 16 is “0” and the values of the word lines depend on the value of A14 and the values of the low order address signals (A0 to A9).

The memory cell array 14 consists of several memory cells 26 which are located in a direction of a row and in a direction of column in a matrix state. The memory cell array 14 has several word lines WL (. . . , WLi, . . . , WLj, . . . ), several control lines CL (. . . , CLi, . . . , CLj, . . .) and several bit lines BL (. . . , BLk, . . .). Every memory cell is controlled by one word line WL and control line CL and interchanges a data with the outside of memory block via one bit line BL. (“i”, “j” and “k” are an arbitrary integer.)

The memory cell 26 consists of one selection transistor 27 and one storage transistor 28. The drain of the selection transistor 27 is connected to one bit line BL, the source is formed commonly with the drain of the storage transistor 28 and the gate is connected to one word line WL. The storage transistor 28 has a floating gate and control gate. The control gate is connected to one control line CL and the source is connected to a common source line SS (CommonSS). The common source line SS becomes a ground level at reading. All the control lines are connected to the sense line SL (. . . , SLk, . . .) via the control line selection transistor 42.

According to the information stored in the storage transistors 28 and 28', a current flows into the memory cells 26 and 26' connected to the selected two word lines WLi and WLj. The current (Iforce) is supplied to the memory cells 26 and 26' by the pull-up PMOS 46 via the bit line selection transistor 44 and the data line DLO. The voltage of the data line DLO, which depends on the specified synthesized current (Icell) into the memory cells 26 and 26' and the current (Iforce) supplied by the pull-up PMOS 46, is amplified and output by the sense amplifier (S. A.) 24.

Figure 2A:
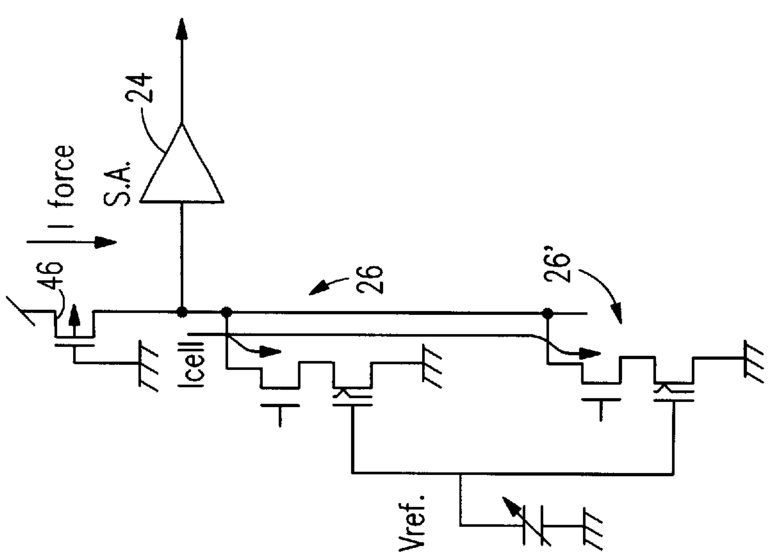
FIG. 2 is a circuit diagram that illustrates a basic operation of the present invention.
Figure 2B:
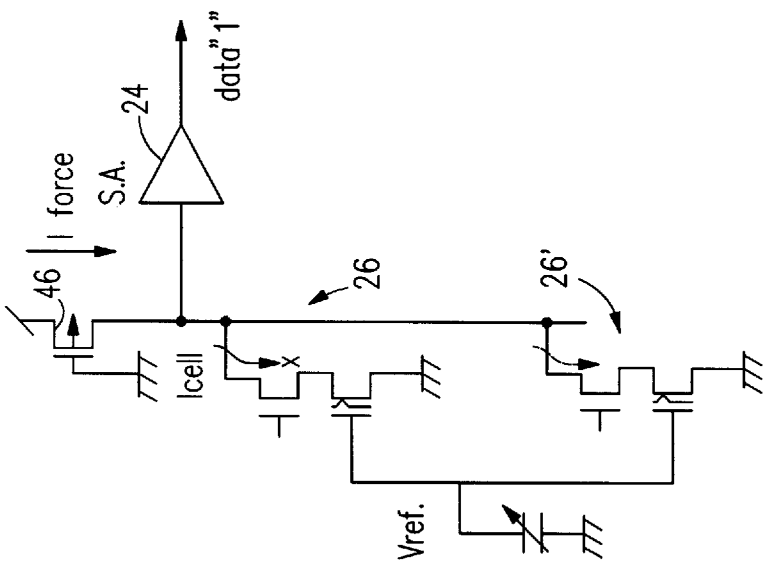
Figure 2C:
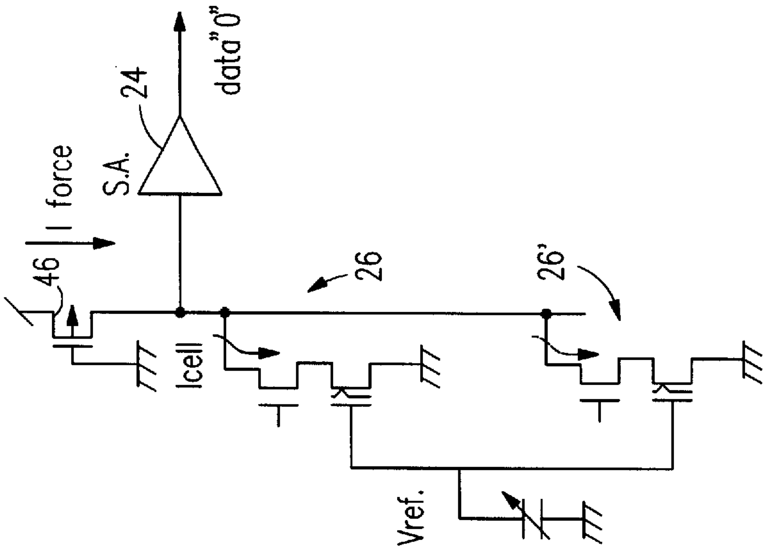

FIGS. 2 (*a*), (*b*) and (*c*) are the circuit diagrams which illustrate a basic operation of this embodiment. FIG. 2 (*a*) shows an operation when both of the memory cells 26 and 26' are correct. FIG. 2 (*b*) shows an operation when the memory cell 26 is correct, the memory cell 26' is defective and the storage state of the memory cell 26 is “1”. FIG. 2 (*c*) shows an operation when the memory cell 26 is correct, the memory cell 26' is defective and the storage state of the memory cell 26 is “0”.

Figure 3:
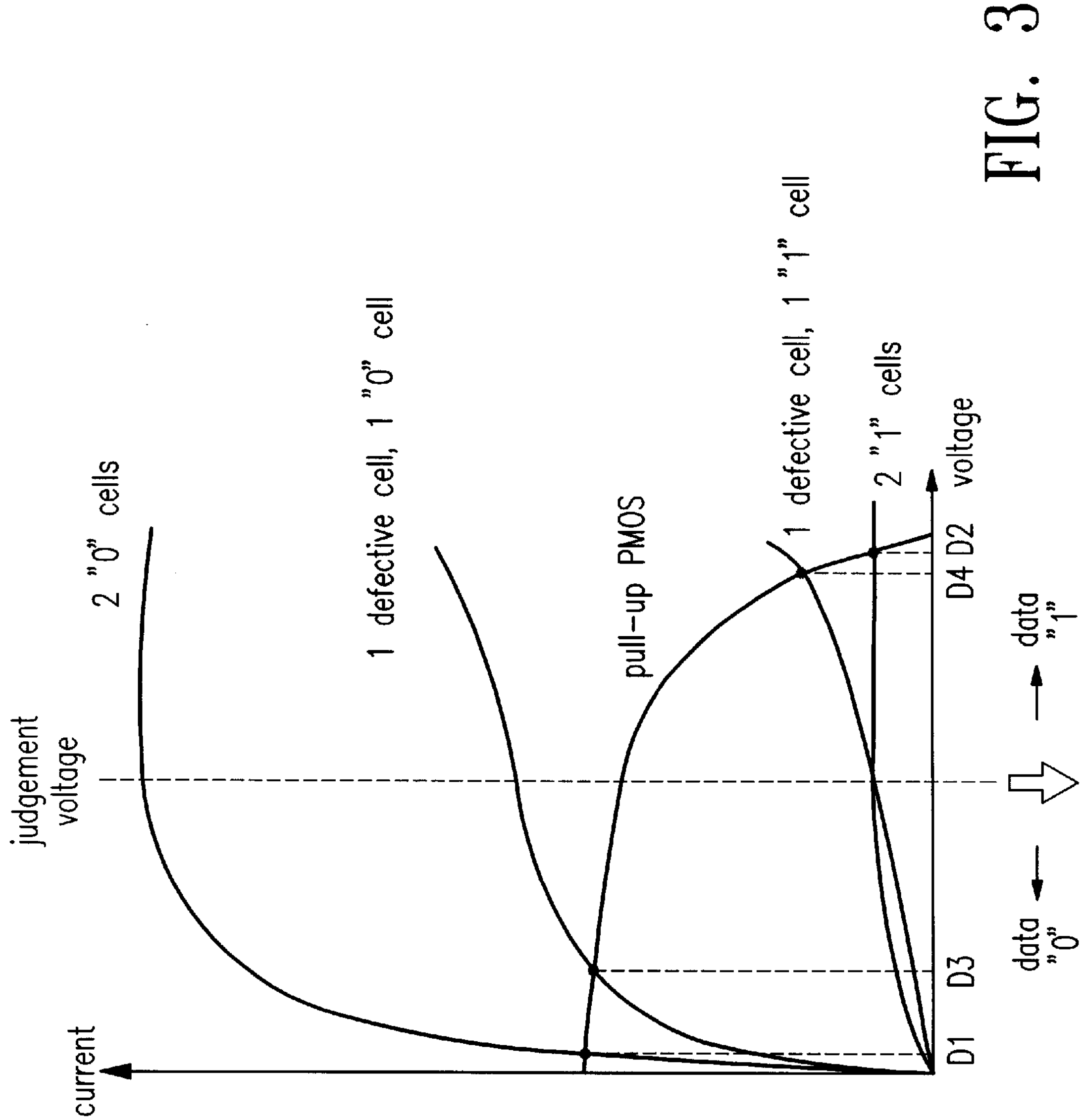
FIG. 3 is an electric characteristics diagram that illustrates a basic operation of the present invention.

FIG. 3 is an electric characteristics diagram which illustrates an operation of the sense amplifier 24. A stable voltage point of the data line DL is the intersections of the current curves of the memory cells (the state "0" and the state "1") and that of the pull-up PMOS. A judgment voltage of the sense amplifier 24 is set at or around the center between the intersection when the state of the memory cell is "0" and the other intersection when the state of the memory cell is "1". A data is judged as "0" if the voltage of the data line DL is lower than the judgment voltage and it is judged as "1" if such voltage of the data line DL is higher. When both of the memory cells 26 and 26' are in the state of correct "0" (D1) and when one memory cell (26') is defective and the storage state of the other memory cell (26) is "0" (D3), it is found that the data is judged as "0". When both of the memory cells 26 and 26' are in the state of correct "1" (D2) and when one memory cell (26') is defective and the storage state of the other memory cell (26) is "1" (D4), it is found that the data is judged as "1". Thus, even if one of the two memory cells is defective, a data can be read out correctly.

When the high order address signals (A10 to A13) are input into the column decoder 20, one bit line selection line COLk is selected by the column decoder 20 and "1" is output to the bit line selection line COLk. The operation of the column decoder 20 in a normal mode is the same as that in a test mode. Also, the operation of the column selector 18 mentioned below in a normal mode is the same as that in a test mode.

In the column selector 18, the bit lines BL (. . . , BLk, . . .), data lines DL (DL0 to DL7), sense lines SL (. . . , SLk, . . .) and common sense line (CommonSL) of the memory cell array 14 are wired. The column selector 18 is controlled by the column decoder 20 via the bit line selection lines COL . . . , COLk, . . .), connects the specified bit line BL and data line DL to each other electrically via the transistor 44 and connects the specified sense line SL and common sense line to each other electrically via the sense line selection transistor 45.

There are eight data lines DL in the first embodiment and those eight data lines (DL0 to DL7) are connected to the data I/O unit 22. In the data I/O unit 22, the signal of every data line DL is amplified by the sense amplifier 24 connected to such every data line and output as data to the outside of the memory block 12.

Figure 4:
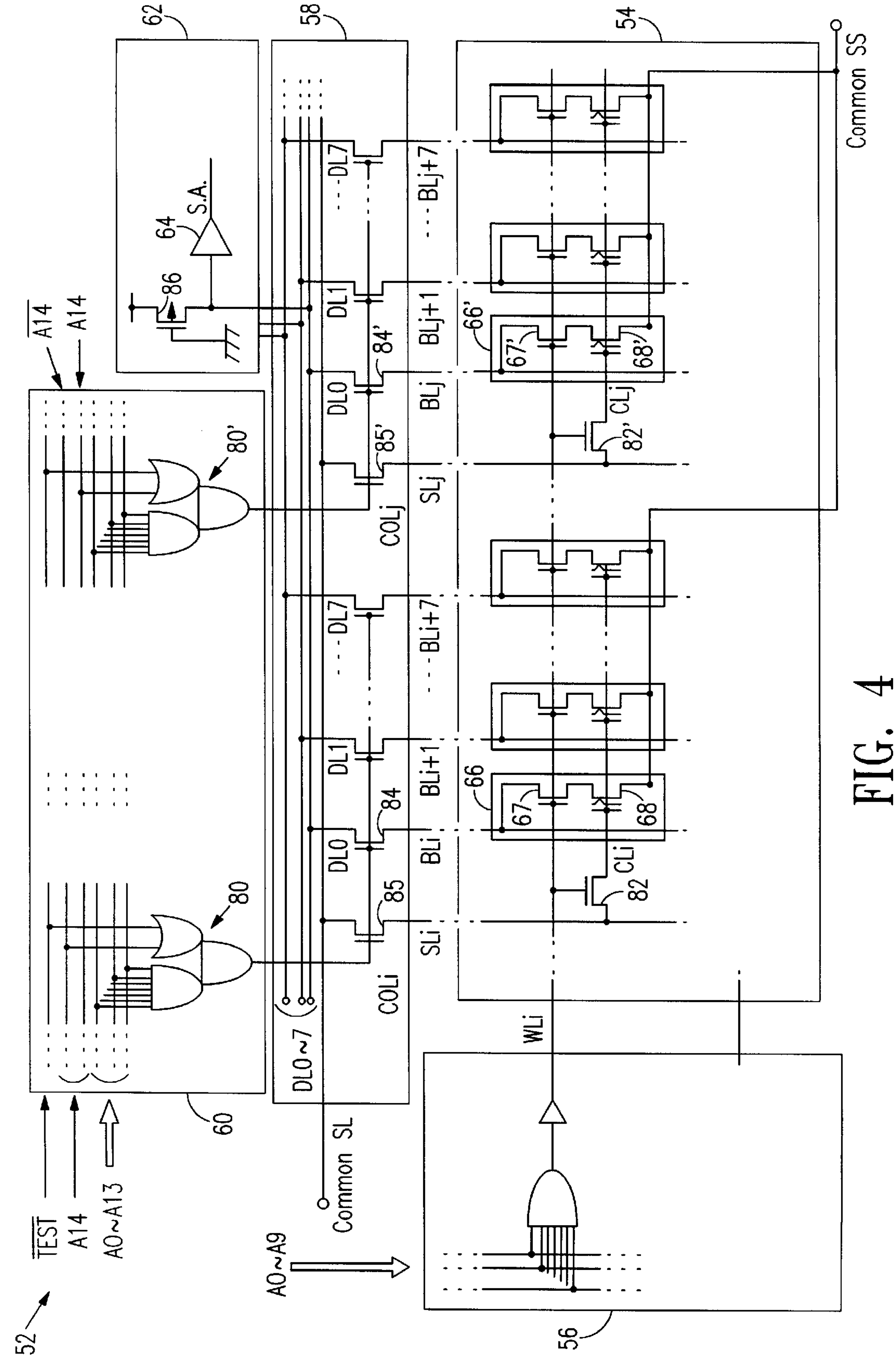
FIG. 4 illustrates the memory block structure in the second embodiment of the present invention.
Figure 5:
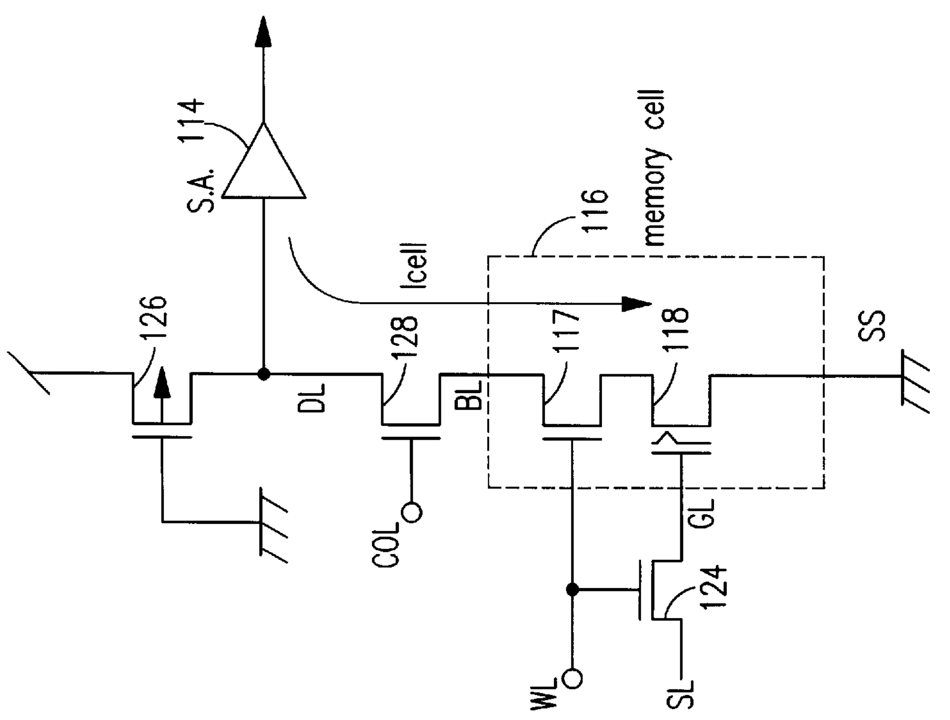
FIG. 5 is a circuit diagram that illustrates an operation of a conventional memory cell.
Figure 6:
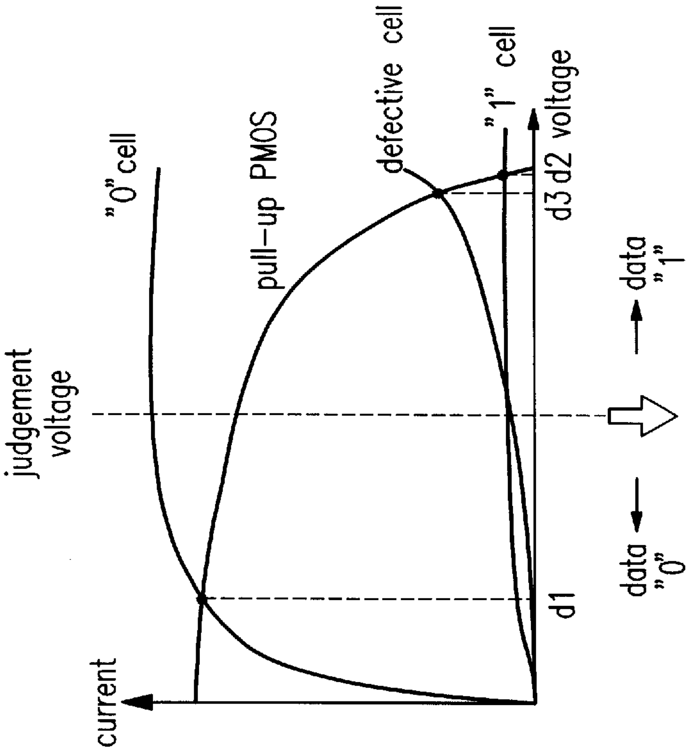
FIG. 6 is a characteristics diagram that illustrates an operation of a conventional memory cell.
Figure 7:
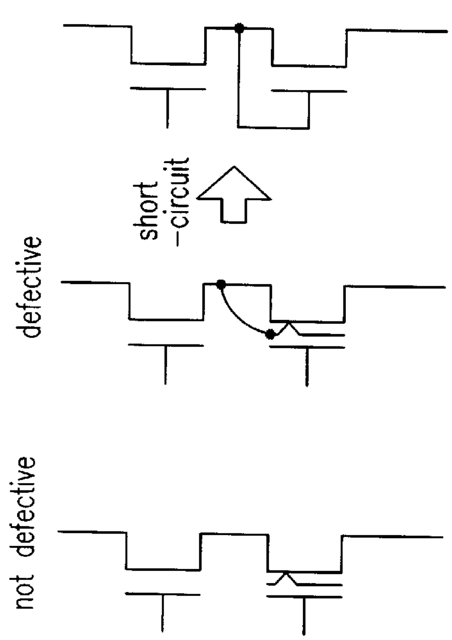
FIG. 7 is an equivalent circuit diagram that illustrates a defective state of a memory cell.

FIG. 4 illustrates the memory block structure of 16 K bytes in the second embodiment of the present invention. The memory block 52 consists of the memory cell array 54, row decoder 56, column selector 58, column decoder 60, data I/O unit 62, etc.

For an address signal line input to the memory block 52, the low order address signal lines (A0 to A9) are connected to the row decoder 56 and the high order address signal lines (A10 to A13) and A14 are connected to the column decoder 60.

When the low order address signals (A0 to A9) are input to the row decoder 56, one word line (WLi) is selected by the row decoder 56 and "1" is output to the word line. The operation of the row decoder 56 in a normal operation is the same as that in a test mode.

According to the information stored in the storage transistors 68 and 68', a current flows into the memory cells 66 and 66' connected to the selected one word line WLi, passes through the bit lines BLi and BLj, respectively and is synthesized at the data line DLO via the bit line selection transistors 84 and 84'. The current is supplied to the data line by the pull-up PMOS 86. The voltage of the data line, which depends on the specified synthesized current (Icell) into the memory cells 66 and 66' and the current (Iforce) supplied by the pull-up PMOS 86, is amplified and output by the sense amplifier 64.

In the normal mode, when the high order address signals (A10 to A13) are input to the column decoder 60, both of the two bit line selection lines COLi and COLj are selected by the column decoder 60 and "1" is output to those two bit selection lines. In the normal mode, the test signal line of the combinational circuit 80 of the column decoder 60 is "1" and, regardless of a value of A14, the values of the bit line selection lines COL depend on the values of the high order address signals (A10 to A13).

In the test mode, when the high order address signals (A10 to A13) and A14 are input to the column decoder 60, one bit line selection line COL is selected by the column decoder 60. In the test mode, the test signal line of the combinational circuit 80 of the column decoder 60 is "0" and the value of the bit line selection line COL depend on the value of A14 and the values of the high order address signals (A10 to A13).

In the column selector 58, the bit lines BL (. . . , BLi, . . . , BLj, . . .), data lines DL (DL0 to DL7), sense lines (. . . , SLi, . . . , SLj, . . .) and common sense line (CommonSL) of the memory cell array 54 are wired. The column selector 58 is controlled by the column decoder 60 via the bit line selection lines COL, connects the specified bit line BL and data line DL to each other electrically via the transistor 84 and connects the specified sense lines (. . . , SLi, . . . , SLj, . . .) to the common sense line electrically via the sense line selection transistor 85.

There are eight data lines DL in the second embodiment and those eight data lines (DL0 to DL7) are connected to the data I/O unit 62. In the data I/O unit 62, the signal of every data line DL is amplified by the sense amplifier 64 connected to such every data line and output as data to the outside of the memory block 52.

Even if the word line is not actually shared by the memory cells 66 and 66', the function of the second embodiment can be achieved by equalizing the electric potential of the word line connected to the memory cell 66 with that of the word line connected to the memory cell 66'.

Figure 8:
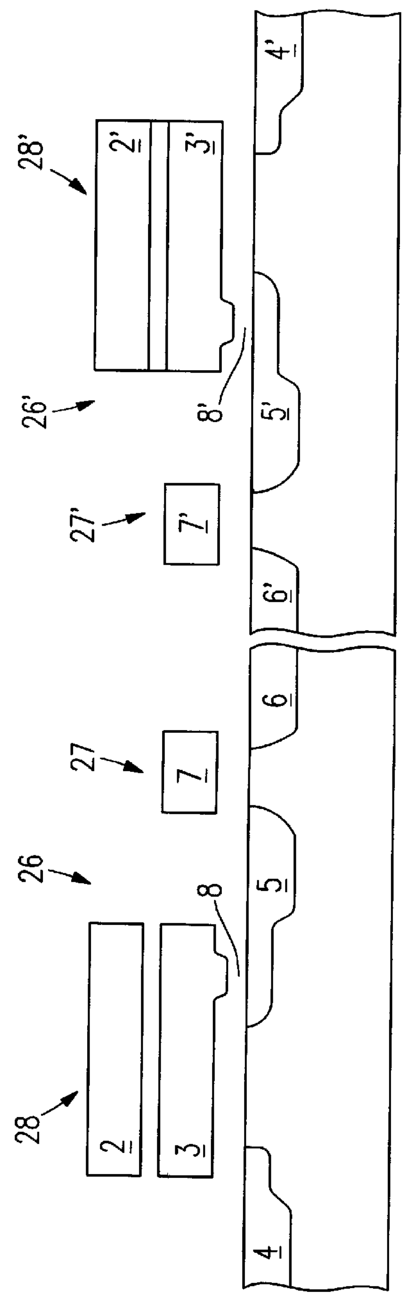
FIG. 8 is a cross-sectional view of a memory cell, which illustrates the third embodiment of the present invention.

In the third embodiment, the memory cell 26 and the memory cell 26' are located symmetrically. FIG. 8 is a cross-sectional view of the memory cell 26 and the memory cell 26'. The memory cells 26 and 26' consist of the selection transistors 27 and 27' and the storage transistors 28 and 28', respectively. The drains 6 and 6' of the selection transistors 27 and 27' are connected to the bit lines and the gates 7 and 7' are connected to the word lines. The sources are formed commonly with the drains 5 and 5' of the storage transistors 28 and 28', respectively. The control gates 2 and 2' of the storage transistors 28 and 28' are connected to the control lines. The electric charge is poured into and extracted from the floating gates 3 and 3' with the tunnel effect through the drains 5 and 5' via the tunnel oxide films 8 and 8'. An interlayer insulation film is formed between the control gate 2 and the floating gate 3 and between the control gate 2' and the floating gate 3'. The sources 4 and 4' of the storage transistor 28 and 28' are connected to the common source line SS.

The semiconductor device achieves a complex circuit by copying the patterns on many photomasks to a wafer. One photomask must be aligned accurately according to a pattern already copied, but it is misaligned very slightly then. The photomask misalignment in the memory cells 26 and 26' affects the electric field strength applied to the tunnel oxide films 8 and 8' of such memory cells. As a result, the difference is made between the time to short-circuit the memory cell 26 and the time to short-circuit the memory cell 26' even if the film quality of the memory cell 26 and that of the memory cell 26' are the same. If the memory cell 26 and the memory cell 26' are located in the same direction, the almost same electric field strength is applied to the tunnel oxide films of those two memory cells. As a result, the time to short-circuit the memory cell 26 and the time to short-circuit the memory cell 26' are the almost same if the film quality of the memory cell 26 and that of the memory cell 26' are the same. On the other hand, if the memory cell 26 and the memory cell 26' are located symmetrically as shown in the third embodiment, the difference is made between the electric field strength applied to the tunnel oxide film of the memory cell 26 and the electric field strength applied to the tunnel oxide film of the memory cell 26'. As a result, the difference is made between the time to short-circuit the memory cell 26 and the time to short-circuit the other memory cell 26' even if the film quality of the memory cell 26 and that of the memory cell 26' are the same. Therefore, as one of the effects, even if the quality of tunnel oxide films of both of those memory cells is poor, the life of either memory cell is extended longer than that of the other memory cell.

For example, if the distance from the end of the selection transistor of the drains 5 and 5' of the storage transistors 28 and 28' to the tunnel oxide films 8 and 8' varies, the parasitic resistance changes and the voltage drops variously, the difference is made between the electric field strength applied to one tunnel oxide film and that applied to another tunnel oxide film, due to photomask misalignment.

The embodiments mentioned above are the examples to describe the present invention. The memory capacity and the number of data lines DL are variable. Moreover, not only two memory cells but also three memory cell are located in parallel.

The embodiments mentioned above describes EEPROM of which memory cell consists of the selection transistor and storage transistor. In addition to the memory cell described in the embodiments above, the present invention is effective for any other memory cells if such memory cells are the non-volatile semiconductor storage device which shows fatigue or destroy arisen from the use.

What is claimed is:

1. A non-volatile semiconductor memory device comprising:

a plurality of memory cells each connected to a bit line and a word line, the memory cells including a plurality of first memory cells and a plurality of second memory cells each corresponding to a first memory cell; and control means for storing the same information in the corresponding first and second memory cells and reading the information stored in the corresponding first and second memory cells by synthesizing the current into the first and second memory cells in a first mode and reading independently the information stored in the first and second memory cells in a second mode.

2. The non-volatile semiconductor storage device claimed in claim 1, wherein the corresponding first and second memory cells are connected to a common bit line and are not adjoined.

3. The non-volatile semiconductor storage device claimed in claim 1, wherein the corresponding first and second memory cells are connected to a common word line and are not adjoined.

4. The non-volatile semiconductor storage device claimed in claim 1, wherein each first memory cell and the corresponding second memory cell are located symmetrically.

5. The non-volatile semiconductor storage device claimed in claim 2, wherein each first memory cell and the corresponding second memory cell are located symmetrically.

6. The non-volatile semiconductor storage device claimed in claim 3, wherein each first memory cell and the corresponding second memory cell are located symmetrically.

* * * * *